(12) United States Patent
Kim et al.

(10) Patent No.: US 10,014,442 B2
(45) Date of Patent: Jul. 3, 2018

(54) METHOD FOR MANUFACTURING VERTICAL TYPE LIGHT EMITTING DIODE, VERTICAL TYPE LIGHT EMITTING DIODE, METHOD FOR MANUFACTURING ULTRAVIOLET RAY LIGHT EMITTING DIODE, AND ULTRAVIOLET RAY LIGHT EMITTING DIODE

(71) Applicant: Korea Polytechnic University Industry Academic Cooperation Foundation, Siheung-si, Gyeonggi-do (KR)

(72) Inventors: Kyoung Kook Kim, Suwon-si (KR); Se Mi Oh, Seoul (KR)

(73) Assignee: Korea Polytechnic University Industry Academic Cooperation Foundation, Siheung-si, Gyeonggi-do (KR)

( * ) Notice: Subject to any disclaimer, the term of this patent is extended or adjusted under 35 U.S.C. 154(b) by 127 days.

(21) Appl. No.: 14/786,100

(22) PCT Filed: Mar. 28, 2014

(86) PCT No.: PCT/KR2014/002642
§ 371 (c)(1),
(2) Date: Oct. 21, 2015

(87) PCT Pub. No.: WO2014/175564
PCT Pub. Date: Oct. 30, 2014

(65) Prior Publication Data
US 2016/0099385 A1    Apr. 7, 2016

(30) Foreign Application Priority Data

Apr. 22, 2013   (KR) .................. 10-2013-0043944
May 6, 2013    (KR) .................. 10-2013-0050633

(51) Int. Cl.
*H01L 33/42*   (2010.01)
*H01L 33/32*   (2010.01)
(Continued)

(52) U.S. Cl.
CPC .......... *H01L 33/42* (2013.01); *H01L 33/0079* (2013.01); *H01L 33/32* (2013.01);
(Continued)

(58) Field of Classification Search
None
See application file for complete search history.

(56) References Cited

U.S. PATENT DOCUMENTS 7,675,075 B2 *   3/2010   Nagai ................ F21K 9/00
                                                    257/90
8,779,441 B2 *   7/2014   Okabe ............... H01L 33/38
                                                    257/730
(Continued)

FOREIGN PATENT DOCUMENTS

KR        100705225 B1    4/2007
KR   10-2007-0063720 A    6/2007
(Continued)

OTHER PUBLICATIONS

International Search Report dated Jun. 26, 2014, issued in PCT Application No. PCT/KR2014/002642, filed Mar. 28, 2014.

*Primary Examiner* — Mary Wilczewski
*Assistant Examiner* — Erik T Peterson
(74) *Attorney, Agent, or Firm* — Workman Nydegger

(57) ABSTRACT

A vertical type light emitting diode includes a nitride semiconductor having a p-n conjunction structure with a transparent material layer formed on a p type clad layer, the transparent material layer having a refractive index different from that of the p type clad layer and having a pattern structure of mesh, punched plate, or one-dimensional grid (Continued)

form, etc. A reflective metal electrode layer is formed on the transparent material layer as a p-electrode. A stereoscopic pattern is formed in the transparent material layer and the p-electrode deposited, and thereby forming the pattern in the p-electrode. Depositing the p-electrode on only 10 to 70% of the upper portion of the p type clad layer in an ultraviolet ray light emitting diode such that an area where the p type clad layer is exposed is wide increases the transmittance of ultraviolet rays through an area where the p-electrode is not deposited.

6 Claims, 18 Drawing Sheets

(51) Int. Cl.
    *H01L 33/00*     (2010.01)
    *H01L 33/40*     (2010.01)
    *H01L 33/38*     (2010.01)
    *H01L 33/22*     (2010.01)

(52) U.S. Cl.
    CPC ............ *H01L 33/38* (2013.01); *H01L 33/405* (2013.01); *H01L 33/22* (2013.01); *H01L 2933/0091* (2013.01)

(56) References Cited

U.S. PATENT DOCUMENTS

| | | | | |
|---|---|---|---|---|
| 2003/0062530 A1* | 4/2003 | Okazaki | ............... | H01L 33/20 257/79 |
| 2004/0012013 A1* | 1/2004 | Katayama | ............... | H01L 33/28 257/13 |
| 2004/0206969 A1* | 10/2004 | Orita | ............... | H01L 33/20 257/97 |
| 2005/0104080 A1* | 5/2005 | Ichihara | ............... | H01L 33/32 257/98 |
| 2006/0033113 A1* | 2/2006 | Lee | ............... | H01L 33/46 257/80 |
| 2006/0076565 A1* | 4/2006 | Murofushi | ............... | H01L 33/22 257/79 |
| 2006/0278888 A1* | 12/2006 | Kim | ............... | H01L 33/20 257/103 |
| 2006/0289886 A1* | 12/2006 | Sakai | ............... | H01L 33/387 257/98 |
| 2007/0267640 A1* | 11/2007 | Lee | ............... | H01L 33/14 257/94 |
| 2008/0043795 A1* | 2/2008 | Hsueh | ............... | H01L 33/10 372/45.01 |
| 2008/0048172 A1* | 2/2008 | Muraki | ............... | H01L 33/38 257/13 |
| 2009/0042328 A1* | 2/2009 | Niki | ............... | H01L 33/007 438/46 |
| 2009/0045434 A1* | 2/2009 | Muraki | ............... | H01L 33/38 257/103 |
| 2009/0078951 A1* | 3/2009 | Miki | ............... | H01L 33/405 257/98 |
| 2009/0309119 A1* | 12/2009 | Shinohara | ............... | H01L 33/38 257/99 |
| 2010/0012971 A1* | 1/2010 | Hiraoka | ............... | H01L 33/38 257/103 |
| 2010/0213488 A1 | 8/2010 | Choi et al. | | |
| 2011/0198642 A1 | 8/2011 | Kim | | |
| 2011/0204397 A1 | 8/2011 | Kim | | |
| 2011/0278538 A1* | 11/2011 | Ko | ............... | H01L 33/20 257/13 |
| 2012/0056150 A1* | 3/2012 | Lee | ............... | H01L 33/38 257/9 |
| 2012/0199860 A1* | 8/2012 | Hodota | ............... | H01L 33/405 257/98 |
| 2013/0049006 A1* | 2/2013 | Hu | ............... | H01L 33/44 257/76 |
| 2013/0228808 A1* | 9/2013 | Lester | ............... | H01L 33/44 257/98 |

FOREIGN PATENT DOCUMENTS

| | | |
|---|---|---|
| KR | 10-2010-0095134 | 8/2010 |
| KR | 10-2011-0094810 A | 8/2011 |
| KR | 10-2011-0096680 A | 8/2011 |
| KR | 10-2012-0081333 A | 7/2012 |

* cited by examiner (a)

(b)

(a)

(b)

(a)

(b)

(a)

(b)

(a)

(b)

(a)

(b)

(c)

(d)

(a)

(b)

(a)

(b)

(a)

(b)

(a)

(b)

(a)            (b)

METHOD FOR MANUFACTURING VERTICAL TYPE LIGHT EMITTING DIODE, VERTICAL TYPE LIGHT EMITTING DIODE, METHOD FOR MANUFACTURING ULTRAVIOLET RAY LIGHT EMITTING DIODE, AND ULTRAVIOLET RAY LIGHT EMITTING DIODE

TECHNICAL FIELD

Exemplary embodiments relate to a method for manufacturing a vertical-type light emitting diode (LED), a vertical-type LED, a method for manufacturing an ultraviolet LED and an ultraviolet LED, and more particularly, to a method for manufacturing a vertical-type LED based on a nitride semiconductor having a p-n conjunction structure which includes forming a transparent material layer having a refractive index different from that of a p-type clad layer on the p-type clad layer, forming a pattern on the transparent material layer, and forming a reflective metal electrode layer as a p-electrode on the transparent material layer formed with the pattern and forms a pattern on the p-electrode by a pattern structure of the transparent material layer to improve reflectance of light and realize a wide range of radiation angles, a vertical-type LED, a method for manufacturing an ultraviolet LED which deposits a p-electrode on a p-type clad layer such that the p-electrode is deposited on only 3% to 70% of area of an upper surface of the p-type clad layer to increase ultraviolet emission efficiency, and an ultraviolet LED.

BACKGROUND ART

A light emitting diode (LED) is a device which converts an electrical signal into light using characteristics of a semiconductor. Since the development of an LED emitting red light in 1962, LEDs emitting various colors of light from infrared rays to visible and ultraviolet rays depending on used materials have been developed. In particular, a vertical-type LED safely emits light with low cost and thus is utilized in a wide range of applications.

Generally, an LED has a conversion efficiency of 40% or higher, and the remaining energy thereof is converted into heat energy. Thus, to solve a heat radiation problem of an LED, an LED with a vertical electrode structure is widely used. KR Patent Registration No. 10-0705225 discloses a method of manufacturing a vertical-type light emitting device. The vertical-type light emitting device is formed by sequentially stacking a light emitting structure and a pair of electrodes. However, a p-electrode used as a reflective electrode has a flat surface to reflect light mostly in the vertical direction, and thus a radiation angle is narrow.

Meanwhile, KR Patent Publication No. 10-2010-0095134 discloses a light emitting device formed in which a transparent electrode layer is formed on a conductive semiconductor layer. A transparent electrode using indium tin oxide (ITO) has excellent current spreading and thus is frequently used as an electrode. However, although an ITO thin film properly transmits infrared and visible light, the ITO thin film absorbs emitted ultraviolet rays with a short wavelength and thus has low transmission of ultraviolet rays emitted from a light emitting diode.

Accordingly, it is needed to develop a high-efficiency vertical-type LED which is capable of dispersing a radiation angle of light horizontally to widen the radiation angle and to increase light extraction efficiency. Also, it is needed to develop a high-efficiency ultraviolet LED emitting ultraviolet rays which does not reduce light output of emitted ultraviolet rays and is capable of achieving a certain level or higher of light properties, while using a traditional electrode material, such as a transparent electrode of ITO or metal electrode.

DISCLOSURE OF INVENTION

Technical Problems

An aspect of the present invention is to provide a vertical-type light emitting diode (LED) which increases reflectance and a radiation angle of light emitted from the vertical-type LED to achieve high light emitting efficiency, and a method for manufacturing the same.

An aspect of the present invention is to provide a vertical-type LED which is capable of improving reflectance with various shapes of patterns and of adjusting a radiation angle as necessary, and a method for manufacturing the same.

An aspect of the present invention is to provide a method for manufacturing an ultraviolet LED which improves transmittance of emitted ultraviolet rays to have excellent efficiency, and an ultraviolet LED.

An aspect of the present invention is to provide a method for manufacturing an ultraviolet LED which is capable of manufacturing an ultraviolet LED with low cost and has a simple manufacture process, and an ultraviolet LED.

Technical Solutions

To achieve the foregoing aspects, a method for manufacturing a vertical-type light emitting diode (LED) based on a nitride semiconductor having a p-n junction structure according to an embodiment of the present invention includes forming a transparent material layer having a refractive index different from that of a p-type clad layer on the p-type clad layer, forming a pattern on the transparent material layer, and forming a reflective metal electrode layer as a p-electrode on the transparent material layer formed with the pattern.

The transparent material layer is formed to have a thickness of 10 nm.

The transparent material layer may be formed by deposition on an entire upper portion of the p-type clad layer, and a pattern structure formed on the transparent material layer has a difference between minimum thickness and maximum thickness of 10 nm.

The transparent material layer may be formed by deposition on part of an upper portion of the p-type clad layer, and a pattern structure formed on the transparent material layer may have a thickness of 10 nm.

The transparent material layer may be formed of at least one selected from a metal oxide group of ITO, ZnO, MgO, SnO, In2O3, Ga2O3, BeO, SiO2, Si3N4, CuO, Cu2O, WO3, TiO2, AgO, Ag2O and NiO or a nitride group of AlN, InN and BN.

The pattern structure formed on the transparent material layer may be formed in a regular arrangement.

The pattern structure formed on the transparent material layer may be circular or polygonal.

The pattern structure of the transparent material layer may be in a linear or lattice form.

The pattern structure of the transparent material layer may be formed in an irregular arrangement in which at least two patterns are mixed.

The reflective metal electrode layer may be formed of at least one metal of Ag, Al, In, Ti, Ni, Cu, Cr, Au, Pd, W and Pt.

A vertical-type light emitting diode according to an embodiment of the present invention may be manufactured by the method for manufacturing the vertical-type LED.

A method for manufacturing an ultraviolet LED according to an embodiment of the present invention forms an ultraviolet LED based on a nitride semiconductor including a nitride semiconductor layer in which an n-type clad layer, an active layer and a p-type clad layer are sequentially stacked, a p-electrode and an n-electrode. The method for manufacturing the ultraviolet LED according to the embodiment of the present invention deposits the p-electrode on the p-type clad layer such that the p-electrode is deposited on only 3% to 70% of area of an upper surface of the p-type clad layer.

The p-electrode may have one of a mesh form, a punched plate form and a one-dimensional grid form.

The method may further form a bonding pad on the p-electrode, wherein gap between the p-electrodes increases radially based on the bonding pad.

The p-electrode may be formed to have a width of 5 nm.

The p-electrode may be formed to have a thickness of 30 nm.

The p-electrode may be formed of one oxide of ITO, ZnO, $Ga_2O_3$, SnO, CuO, $Cu_2O$, $AgO_2$ and AgO.

The p-electrode may be formed of at least one metal of Ag, Ni, Pd, In, Zn, Mg and Pt.

Width of the p-electrode located adjacent to the bonding pad may be non-uniform.

An ultraviolet light emitting diode according to an embodiment of the present invention may be manufactured by the method for manufacturing the ultraviolet LED.

Advantageous Effects

In a vertical-type light emitting diode (LED) and a method for manufacturing the same according to the present invention, a pattern is formed on a p-electrode to improve reflectance of light and widen a radiation angle of emitted light, and reflection of light is increased due to a difference in refractive index, thus enhancing light emitting efficiency of the LED.

In a vertical-type LED and a method for manufacturing the same according to the present invention, a pattern is formed on a p-electrode in various shapes to adjust a radiation angle as necessary.

In a method for manufacturing an ultraviolet LED and an ultraviolet LED according to the present invention, a structure and form of a p-electrode on a p-type clad layer allow injected electric current to smoothly spread and minimize an area of the p-electrode to increase transmittance of emitted ultraviolet rays, thereby manufacturing a high-efficiency ultraviolet LED.

In a method for manufacturing an ultraviolet LED and an ultraviolet LED according to the present invention, not only a transparent oxide electrode material, such as ITO, but an electrode of a metal material having substantially high contact resistance and conductivity for a p-electrode are used to manufacture ultraviolet LED with excellent light emitting efficiency.

BRIEF DESCRIPTION OF DRAWINGS (a) and (b) in FIG. 1 schematically illustrate a vertical-type light emitting diode (LED) according to an embodiment of the present invention.

Figure 4:
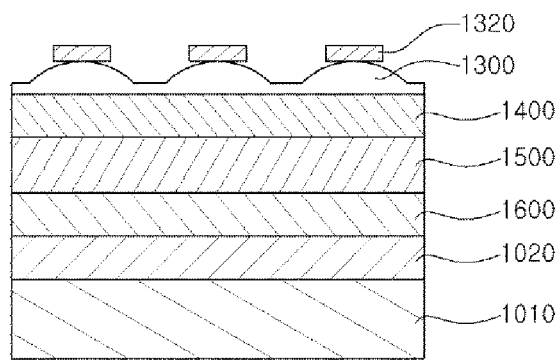
Figure 4:
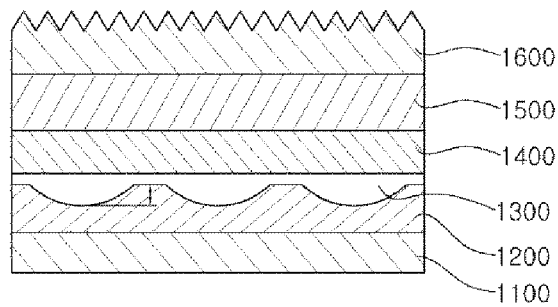

(a) and (b) in FIG. 4 illustrate a shape of a p-electrode when a transparent material layer has a pattern in an oval shape in a vertical-type LED according to another embodiment of the present invention.

Figure 5:
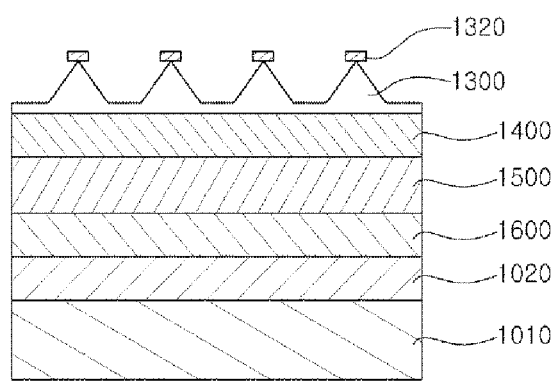
Figure 5:
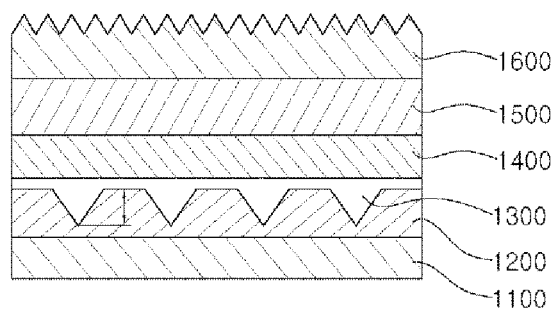

(a) and (b) in FIG. 5 illustrate a shape of a p-electrode when a transparent material layer has a pattern in a quadrangular pyramid shape in a vertical-type LED according to another embodiment of the present invention.

Figure 6:
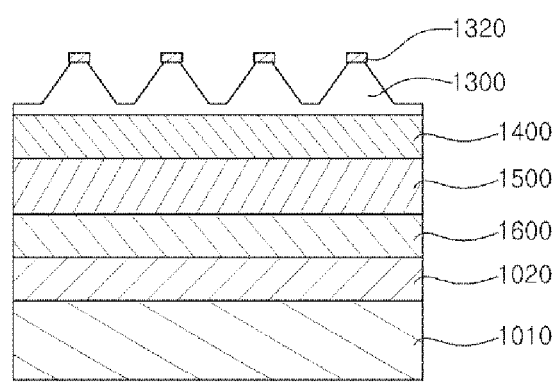
Figure 6:
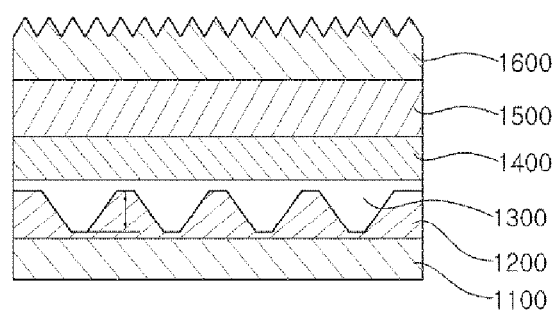

(a) and (b) in FIG. 6 illustrate a shape of a p-electrode when a transparent material layer has a pattern in a quadrangular pyramidal frustum shape in a vertical-type LED according to another embodiment of the present invention.

Figure 7:
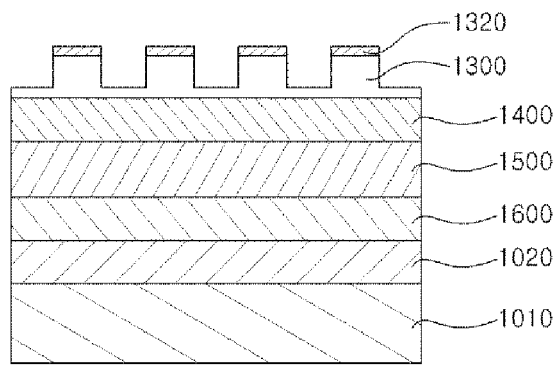
Figure 7:
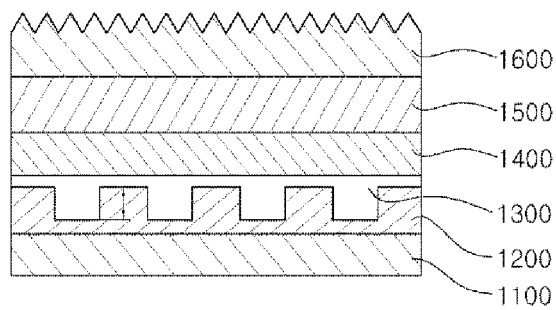

(a) and (b) in FIG. 7 illustrate a shape of a p-electrode when a transparent material layer has a pattern in a linear shape in a vertical-type LED according to another embodiment of the present invention.

Figure 8:
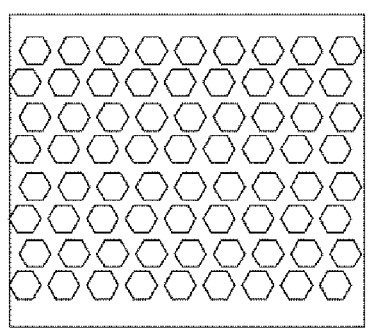
Figure 8:
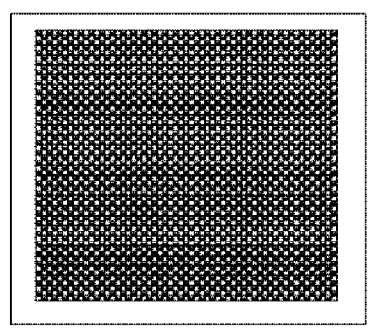
Figure 8:
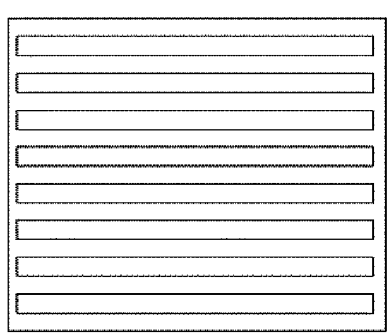
Figure 8:
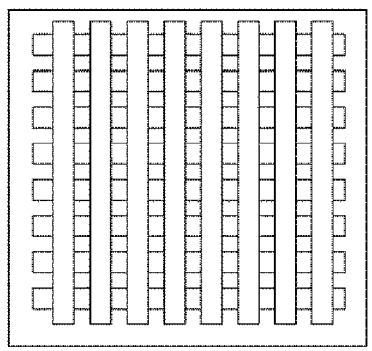

(a) to (d) in FIG. 8 illustrate various pattern shapes of a transparent material layer in a vertical-type LED according to another embodiment of the present invention.

Figure 9:
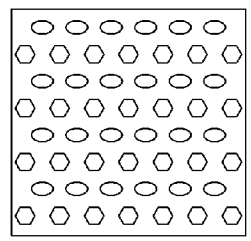

FIG. 9 illustrates a pattern in an irregular shape of a transparent material layer in a vertical-type LED according to another embodiment of the present invention.

Figure 10:
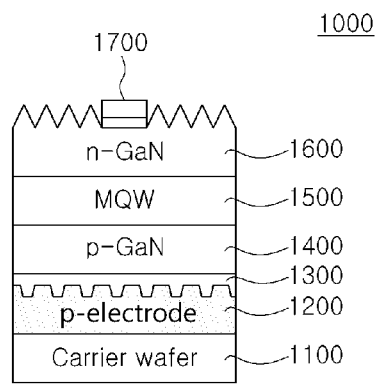
Figure 10:
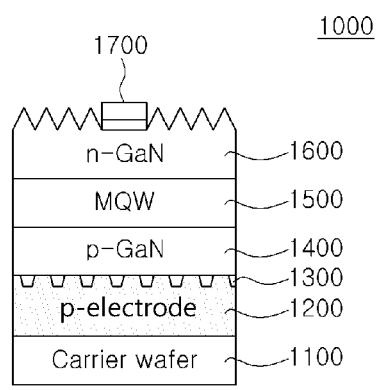

(a) and (b) in FIG. 10 illustrate deposited forms of a transparent material layer according to an embodiment of the present invention.

Figure 11:
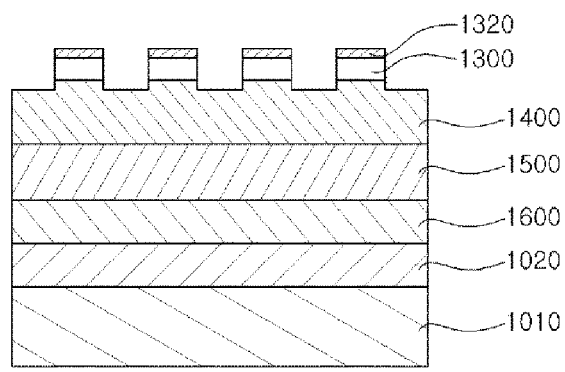
Figure 11:
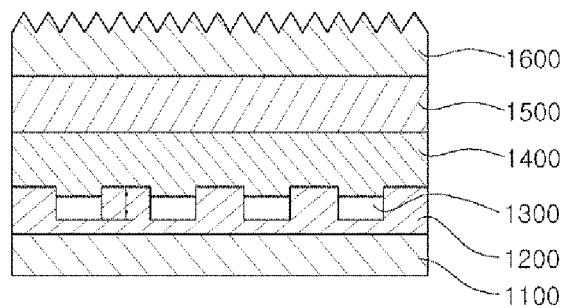

FIG. 11 illustrates that a transparent material layer is deposited on a portion of a p-type clad layer in a vertical-type LED according to another embodiment of the present invention.

Figure 12:
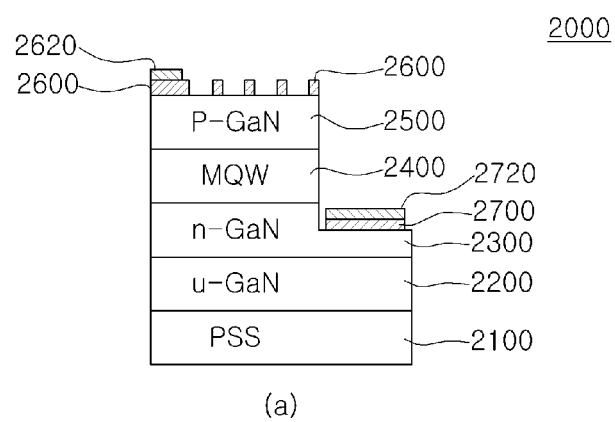
Figure 12:
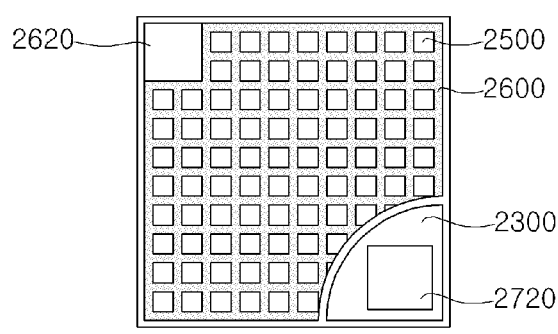

(a) and (b) in FIG. 12 schematically illustrate an ultraviolet LED according to an embodiment of the present invention.

Figure 13:
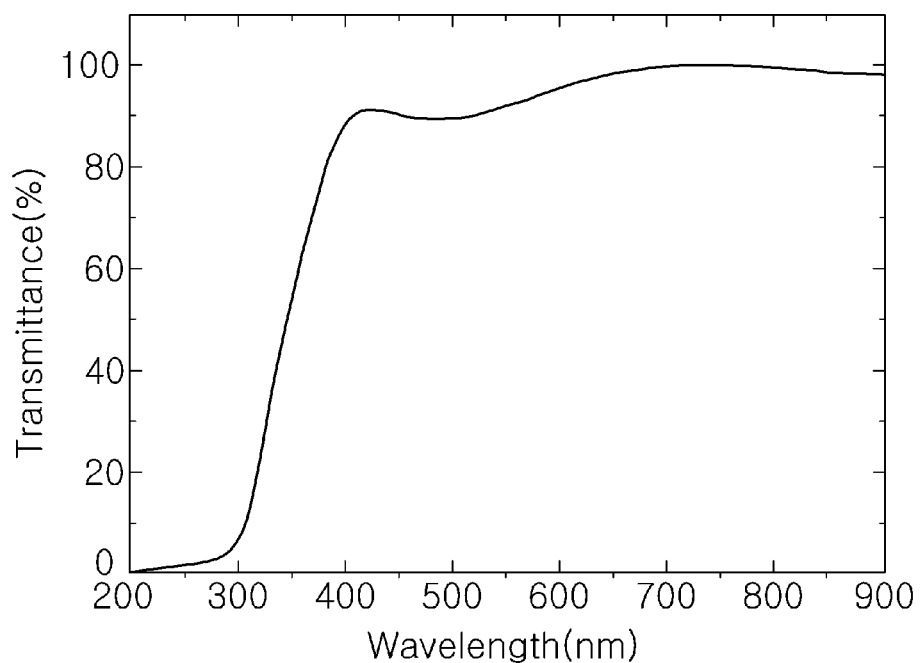

FIG. 13 illustrates transmittance of an ITO thin film according to a wavelength of light.

Figure 14:
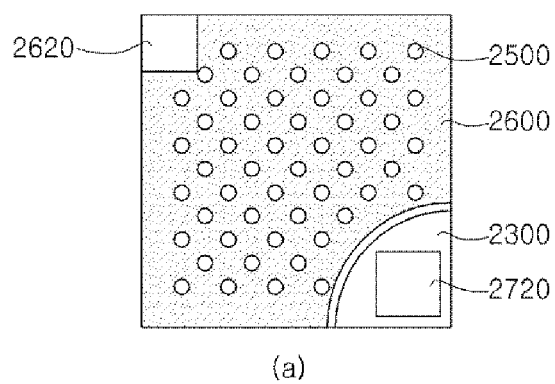
Figure 14:
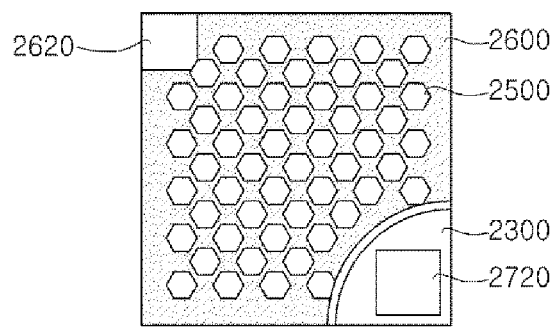

(a) and (b) in FIG. 14 illustrate a p-electrode in a punched plate form in an ultraviolet LED according to another embodiment of the present invention.

Figure 15:
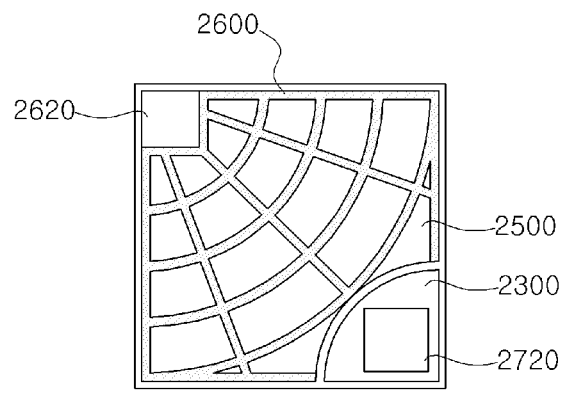

FIG. 15 illustrates a p-electrode in a one-dimensional grid form in an ultraviolet LED according to another embodiment of the present invention.

Figure 16:
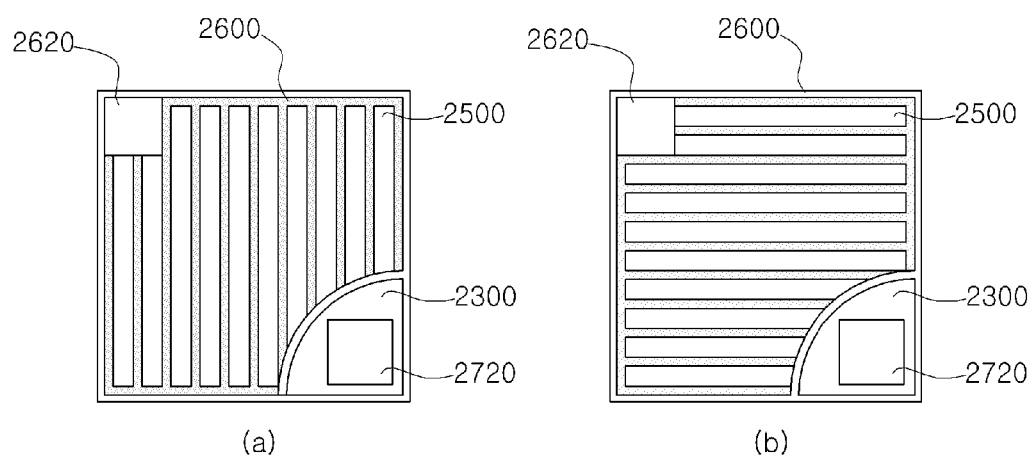

FIG. 16 illustrates a p-electrode in a one-dimensional grid form in an ultraviolet LED according to another embodiment of the present invention.

Figure 17:
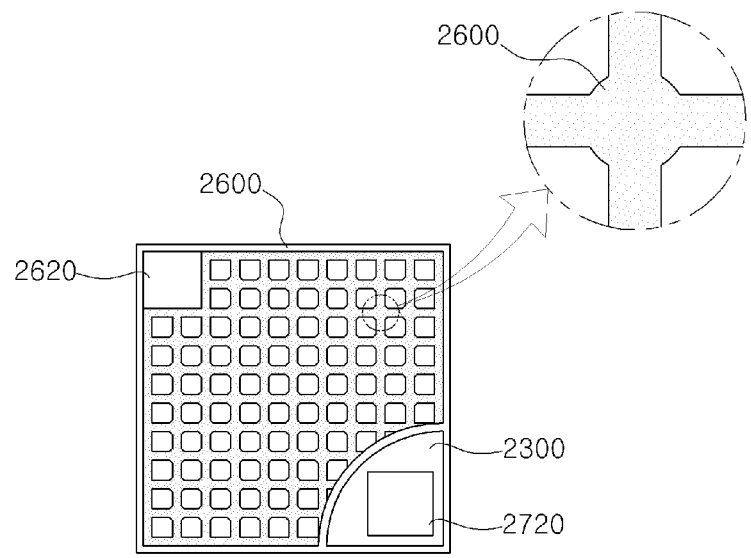

FIG. 17 illustrates a p-electrode in a one-dimensional grid form in an ultraviolet LED according to another embodiment of the present invention.

Figure 18:
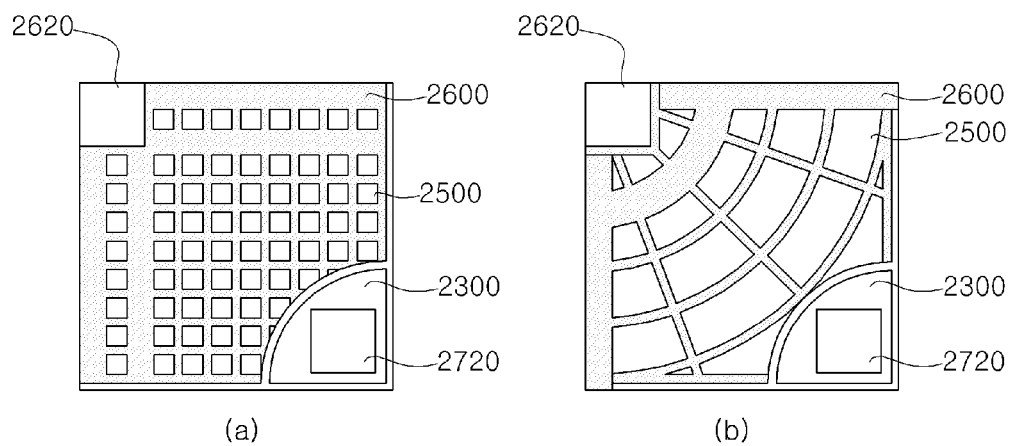

FIG. 18 illustrates width of a portion of a p-electrode adjacent to a bonding pad in an ultraviolet LED according to an embodiment of the present invention.

BEST MODE FOR CARRYING OUT THE INVENTION

Figure 3A:
FIGS. 3a to 3m illustrate a process of forming each layer of the vertical-type LED according to the embodiment of the present invention.

To manufacture a vertical-type light emitting diode (LED) according to the present invention, as shown in FIG. 3a, a buffer layer 1020 is deposited on a substrate 1010. The substrate 1010 may generally employ silicon (Si), silicon carbide (SiC), sapphire (Al2O3), gallium arsenide (GaAs) or the like. In the present embodiment, a sapphire substrate is used as the substrate 1100.

Figure 3B:
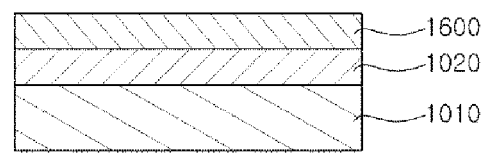

The buffer layer 1020 is formed on the substrate 1010. Next, as shown in FIG. 3b, an n-type clad layer 1600 is deposited on the buffer layer 1020. The n-type clad layer 1600 is mostly formed of GaN or AlGaN.

Figure 3C:
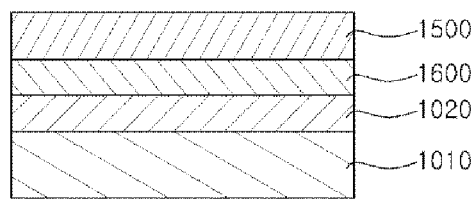
Figure 3D:
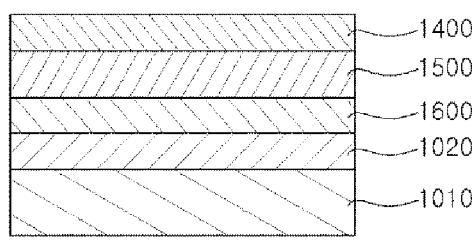

An active layer 1500 is formed on the n-type clad layer 1600 (FIG. 3c). As shown in FIG. 3d, a p-type clad layer 1400 is deposited on the active layer 1500. The p-type clad layer 1400 may be formed of GaN, AlGaN or the like.

Figure 3E:
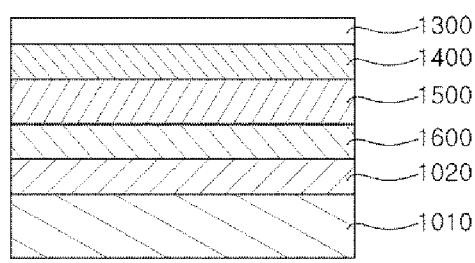

As shown in FIG. 3e, a transparent material layer 1300 is deposited on the p-type clad layer 1400 in order to form a pattern of the p-electrode 1200. A material forming the transparent material layer 1300 has a refractive index different from that of the p-type clad layer 1400. The transparent material layer 1300 may be deposited using sputtering, electron beams, laser beams or the like. The deposited transparent material layer 1300 may have a thickness of 10 nm. The transparent material layer 1300 may be formed of one material or an alloy of two or more materials selected from a metal oxide group of ITO, ZnO, Ga2O3, NiO, Cu2O, CuO, MgO, SnO, In2O3, BeO, SiO2, Si3N4, WO3, TiO2, AgO and Ag2O or a nitride group of AlN, InN and BN. The transparent material layer 1300 is patterned in various shapes to pattern the p-electrode 1200.

Figure 3F:
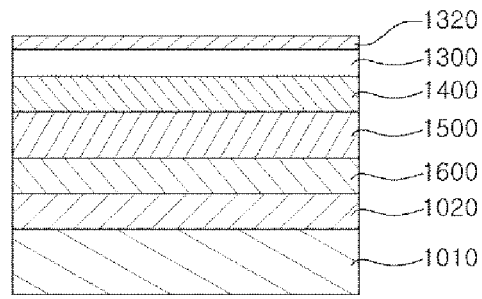
Figure 3G:
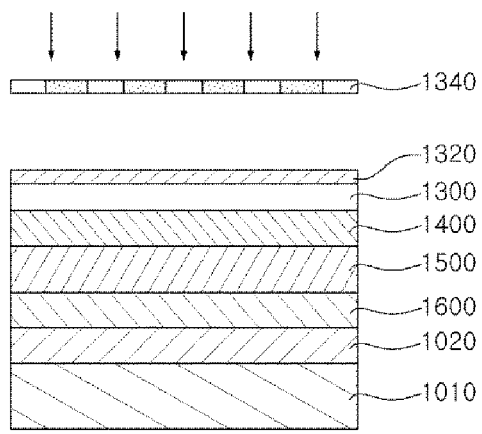
Figure 3H:
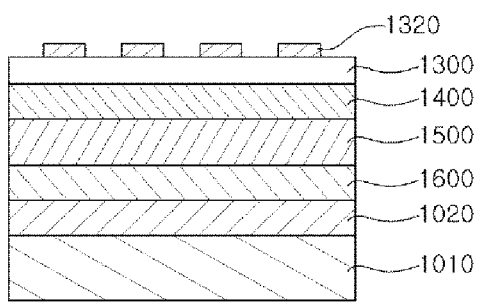
Figure 3I:
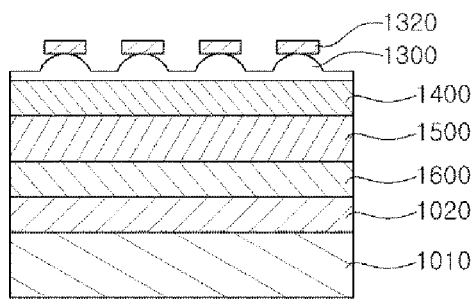

As shown in FIG. 3f, a photoresist 1320 is applied to the transparent material layer 1300 to form a pattern on the transparent material layer 1300. A mask pattern 1340 is disposed over the transparent material layer 1300 with the photoresist 1320 applied, and the transparent material layer 1300 is irradiated with ultraviolet rays (FIG. 3g). The transparent material layer 1300 exposed to light is subjected to wet etching to more deeply etch portions of the transparent material layer 1300 where the photoresist 1320 is removed, thereby forming stereoscopic pattern on the transparent material layer 1300 in a pattern on the photoresist 1320 (FIGS. 3h and 3i). The stereoscopic pattern on the transparent material layer 1300 may be formed to have a thickness difference between a thinnest portion and a thickest portion of 10 nm.

Figure 3J:
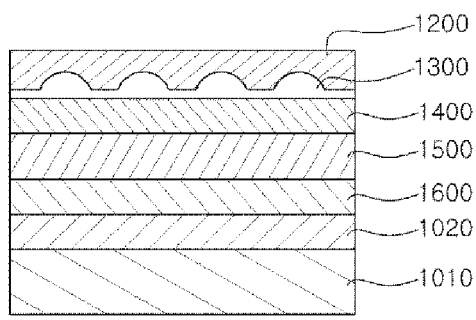

As shown in FIG. 3i, the transparent material layer 1300 is etched in an embossed hemispherical shape. A p-electrode 1200 is deposited on the transparent material layer 1300 (FIG. 3j). The p-electrode 1200 is formed of a metal or alloy of Ag, Au, Ni, Ru, Ir, Ni, Cu, Cr and the like. The p-electrode 1200 is a reflective metal electrode which forms an ohmic electrode and reflects light emitted from the active layer. After the p-electrode 1200 is formed, the p-electrode 1200 may be subjected to heat treatment under a nitrogen, oxygen or vacuum atmosphere. Although the p-electrode 1200 serves as a reflective metal electrode in the present embodiment, a p-electrode 1200 forming an ohmic electrode may be formed and then a reflective layer may be further provided on the p-electrode 1200. The p-electrode and the reflective layer may be formed of a single metal or alloy of Ag, Al, Ni, Cu, Cr, Au, Cr, Pd and the like.

Further, as the transparent material layer 1300, an oxide may be employed to form a pattern on only a portion of the p-layer, in addition to a conductive material, such as a transparent electrode. In this case, in addition to a conventional conductive transparent electrode, a nonconductive transparent material may be used for patterning. The nonconductive transparent material may include SiO2, Al2O3, AlN and the like.

Figure 1:
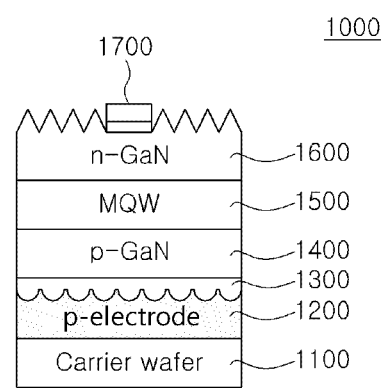
Figure 1:
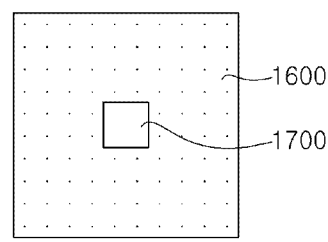

The p-electrode 1200 is formed on the transparent material layer 1300 formed with the stereoscopic pattern, so that a boundary surface between the p-electrode 1200 and the transparent material layer 1300 has an uneven form. When the manufactured LED 1000 is turned over, the transparent material layer 1300 is in an embossed form and the p-electrode 1200 has an engraved pattern. That is, as shown in FIG. 1, the p-electrode 1200 has a hemispherical engraved pattern, and emitted light is reflected on the p-electrode 1200 formed with the pattern to be emitted at a wider range of radiation angles.

Figure 3K:
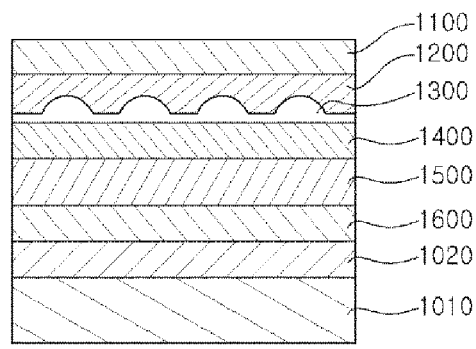

A carrier 1100 is formed on the p-electrode 1200 (FIG. 3k). The carrier 1100 may be formed by electroplating, non-electrolyte plating, sputtering, or wafer bonding of a conductive substrate.

Subsequently, the substrate 1010 is removed by a laser lift-off (LLO) process. When the sapphire substrate 1010 is irradiated with a laser, the surface of the buffer layer 1020 of gallium nitride is decomposed into gallium (Ga) and nitrogen gas (N2), thus separating the substrate 1010. Although the LLO process is used to separate the substrate 1010 in the present embodiment, chemical lift-off may also be used. After the substrate 1010 is removed, the buffer layer 1020 is removed by etching.

Figure 3L:
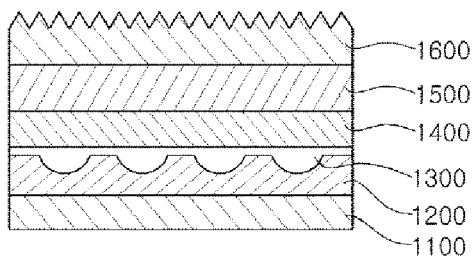
Figure 3M:
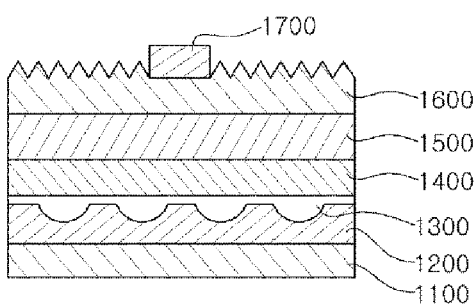

When the LED from which the substrate 1010 and the buffer layer 1020 are removed is turned over, as shown in FIG. 3l, the p-electrode 1200, the transparent material layer 1300, the p-type clad layer 1400, the active layer 1500 and the n-type clad layer 1600 are sequentially deposited on the carrier 1100. A surface of the n-type clad layer 1600 exposed by etching the buffer layer 1020 is roughened to form a texturing on the surface, thereby increasing light extraction efficiency of the vertical-type LED.

An n-electrode 1700 is deposited on the n-type clad layer 1600 of the turned over LED. The n-electrode 1700 may be formed of a metal, such as Ti, Cr or Al, or a transparent electrode, such as ITO or ZnO. The n-electrode 1700 is disposed on top of the turned over LED 1000. Although the n-electrode 1700 occupies a small area on the n-type clad layer 1600, the n-electrode 1700 is formed as an ohmic contact, thereby manufacturing the LED being excellent in current spreading and light emitting efficiency with the n-electrode 1700 occupying a reduced area.

After the p-electrode 1200 and the n-electrode 1700 are formed, bonding pads for wire bonding are formed on the p-electrode 1200 and the n-electrode 1700.

To manufacture an ultraviolet LED according to another embodiment of the present invention, a buffer layer 2200, an n-type clad layer 2300, an active layer 2400, a p-type clad layer 2500, a p-electrode 2600 and an n-electrode 2700 are formed on a substrate 2100. The substrate 2100 may generally employ silicon (Si), silicon carbide (SiC), sapphire (Al2O3), gallium arsenide (GaAs) or the like. The buffer layer 2200 is formed on the substrate 2100, and the n-type clad layer 2300 is deposited on the buffer layer 2200. The n-type clad layer 2300 is mostly formed of GaN or AlGaN.

The active layer 2400 is formed on the n-type clad layer 2300. A wavelength of light emitted from the ultraviolet LED is determined depending on types of materials forming the active layer 2400 and thickness of the active layer 2400. The active layer for ultraviolet light emitting may employ GaN, AlGaN, InGaN or AlGaInN including a small amount of indium (In) or the like. In the present embodiment, composition of materials forming the active layer 2400 is adjusted so that the wavelength of the emitted light is 280 to 400 nm.

The p-type clad layer 2500 is deposited on the active layer 2400. In the ultraviolet LED based on a nitride semiconductor, the p-type clad layer 2500 is formed of GaN, AlGaN or the like. Using an Al-based element the p-type clad layer 2500 may further widen a band gap. As necessary, a heavily doped p-type clad layer or a p-InGaN layer including a small amount of In may be deposited on the p-type clad layer to improve ohmic contact resistance with an electrode layer.

The p-electrode 2600 and the n-electrode 2700 are formed on a nitride semiconductor layer or partially etched nitride semiconductor layer. The p-type clad layer 2500, the active layer 2400 and the n-type clad layer 2300 are partially etched to expose the n-type clad layer 2300, thereby preparing an area for the n-electrode 2700. The n-electrode 2700 is formed on the exposed n-type clad layer 2300. The n-electrode 2700 may be formed of a metal, such as Cr or Al. After the p-electrode 2600 and the n-electrode 2700 are formed, bonding pads 2620 and 2720 for wire bonding are formed on the p-electrode 2600 and the n-electrode 2700.

Next, the p-electrode 2600 is described.

The p-electrode 2600 is deposited on the p-type clad layer 2500. The p-electrode 2600 is deposited using an ITO material with excellent contact resistance and current spreading and particularly high transmittance. The deposited ITO has a thickness of 30 nm. Light emitted from the active layer 2400 exits through the p-electrode 2600 in contact with an upper portion of the p-type clad layer 2500. However, when an ITO thin film is used as the p-electrode, as shown in FIG. 13, the ITO thin film exhibiting high transmittance in a visible light region has dramatically reduced transmittance in an ultraviolet region of 400 nm or less due to high absorption rate. Thus, when an ITO thin film is used as the p-electrode 2600 in the ultraviolet LED 2000, the ITO thin film absorbs ultraviolet rays emitted from the active layer of the LED to significantly reduce light extraction efficiency of the LED, resulting in a decrease in light efficiency of the LED. Accordingly, in the present invention, the p-electrode 2600 is deposited to occupy 70% or less of the area of the p-type clad layer 2500 in order to reduce absorption rate of emitted ultraviolet rays passing through the ITO electrode.

To this end, in the present embodiment, the ITO p-electrode is manufactured in a mesh form. That is, the p-electrode 2600 is selectively deposited on only a portion of the p-type clad layer 2500. Width of lines of the p-electrode in the mesh form may be changed from several nanometers to tens of micrometers. As the width of the lines is thinner, the p-electrode 2600 occupies a smaller area in the ultraviolet LED 2000, thereby improving efficiency of the ultraviolet LED 2000.

In detail, the p-electrode 2600 may have a width of 5 nm. As the width of the lines of the p-electrode 2600 is thinner, the p-electrode 2600 occupies a smaller area on the p-type clad layer 2500, thereby improving efficiency of the ultraviolet LED. The width of the lines of the p-electrode may be changed up to tens of micrometers depending on a material forming the p-electrode 2600 and characteristics of the nitride semiconductor forming the p-type clad layer 2500.

Meanwhile, thickness of the p-electrode 2600 may be changed to improve characteristics of the electrode, such as current spreading. Specifically, the p-electrode 2600 may be formed to have a thickness of 30 nm. When the thickness of the p-electrode 2600 is greater, the characteristics including current spreading may be less affected with the width of the lines of the p-electrode 2600 being thin. The thickness of the p-electrode 2600 may vary depending on material qualities and characteristics of the ultraviolet LED based on the nitride semiconductor.

MODE FOR CARRYING OUT THE INVENTION

Hereinafter, exemplary embodiments of the present invention will be described in detail with reference to the accompanying drawings. Here, it should be noted that like reference numerals present in the drawings denote like elements in the accompanying drawings. Further, a detailed description of well-known functions or configurations will be omitted in order not to unnecessarily obscure the subject matter of the present invention. For the same reason, some components shown in the accompanying drawings are exaggerated, omitted or schematically illustrated.

Figure 2:
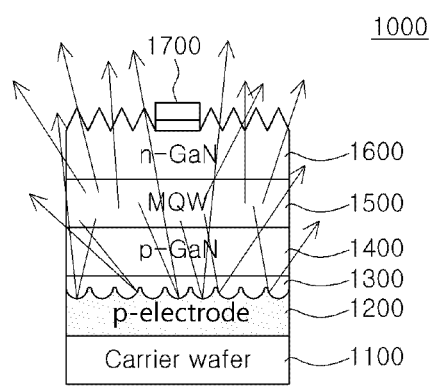
FIG. 2 is a diagram illustrating emission of light from the vertical-type LED according to the embodiment of the present invention.

(a) and (b) in FIG. 1 schematically illustrate a vertical-type LED according to an embodiment of the present invention, and FIG. 2 is a diagram illustrating emission of light from the vertical-type LED according to the embodiment of the present invention.

As show in FIG. 1, the vertical-type LED 1000 according to the embodiment of the present invention includes a carrier 1100, a p-electrode 1200, a transparent material layer 1300, a p-type clad layer 1400, an active layer 1500, an n-type clad layer 1600 and an n-electrode 1700.

The p-electrode 1200 is disposed on the carrier 1100. The p-electrode 1200 is formed of a reflective metal electrode. The p-electrode 1200 is formed of a metal oxide or metal selected from a metal oxide group of ITO, ZnO, Ga2O3, MgO, MgZnO, ZnGaO and the like and a metal group of In, Sn, Ag, Au, Al, Ti, Ni, Cu, Cr, Ru, Pd, W, Pt and the like or may be formed of a single metal oxide or metal or an alloy of two selected from a metal oxide group of ITO, ZnO, Ga2O3, MgO, MgZnO, ZnGaO and the like and a metal group of In, Sn, Ag, Au, Al, Ti, Ni, Cu, Cr, Ru, Pd, W, Pt and the like.

After the p-electrode 1200 is formed, the p-electrode 1200 may be subjected to heat treatment under a vacuum, nitrogen or oxygen atmosphere. Although the p-electrode 1200 serves as a reflective metal electrode in the present embodiment, a reflective layer may be further provided in addition to the p-electrode 1200 forming an ohmic electrode. The p-electrode and the reflective layer may be formed of a single metal or alloy of Ag, Al, Ni, Cu, Cr, Au, Cr, Pd and the like.

A pattern is formed on the p-electrode 1200. For example, a hemispherical pattern array may be formed in an upper surface of the p-electrode 1200. As shown in FIG. 2, light is reflected by the pattern formed on the p-electrode 1200 to widen an angle of the emitted light, and thus a radiation angle of the LED becomes wide. Since a transparent material having a different refractive index is used in patterning, reflectivity may also be increased accordingly.

The transparent material layer 1300 is disposed on the p-electrode 1200. GaN-based materials have a refractive index of about 2.35, in which light is not totally reflected in the LED and is emitted to the outside in a narrow range of angles when light is emitted out of the LED. To this end, in the present invention, a pattern is formed on the p-electrode 1200 to reflect light at different angles on the p-electrode 1200, that is, the reflective electrode, thereby widening a range of angles of emitted light. The transparent material layer 1300 is for patterning the p-electrode 1200 and is patterned in various shapes as necessary. The transparent material layer 1300 has a thickness of tens of nanometers to tens and may be formed of ITO, ZnO, Ga2O3, NiO, Cu2O, CuO and the like. The transparent material layer 1300 is patterned into a stereoscopic form by etching. The transparent material layer 1300 has a different refractive index from that of the p-type clad layer, which will be described below.

Further, an oxide may be employed to form a pattern on only a portion of the p-layer, in addition to a conductive material, such as a transparent electrode. In this case, in addition to a conventional conductive transparent electrode, a nonconductive transparent material may be used for patterning. The nonconductive transparent material may include SiO2, Al2O3, AlN and the like.

The p-type clad layer 1400 is disposed on the transparent material layer 1300, and the active layer 1500 is disposed on the p-type clad layer 1400. The n-type clad layer 1600 is disposed on the active layer 1500. A texturing may be formed on an upper surface of the n-type clad layer 1600, which may enhance light extraction efficiency.

The n-electrode 1700 is deposited on the n-type clad layer 1600. The n-electrode 1700 may be formed of a metal, such as Ti, Cr or Al, or a transparent electrode, such as, ITO and ZnO. An ohmic contact layer may be formed between the n-type clad layer 1600 and the n-electrode 1700.

Bonding pads (not shown) for wire bonding are formed on the p-electrode 1200 and the n-electrode 1700.

FIGS. 3a to 3m illustrate a process of forming each layer of the vertical-type LED according to the embodiment of the present invention.

To manufacture a vertical-type LED according to the present invention, as shown in FIG. 3a, a buffer layer 1020 is deposited on a substrate 1010. The substrate 1010 may generally employ silicon (Si), silicon carbide (SiC), sapphire (Al2O3), gallium arsenide (GaAs) or the like. In the present embodiment, a sapphire substrate is used as the substrate 1100. A sapphire substrate has an excellent light extraction effect and high durability. Although a sapphire substrate is used as the substrate 1100 in the present embodiment, various substrates may be used, without being limited thereto.

The buffer layer 1020 is formed on the substrate 1010. The buffer layer 1020 is used as a layer for buffering stress between the substrate and a layer stacked thereon. The buffer layer 1020 is formed on the substrate 1010 for lattice matching. In a process of stacking a metal layer on the substrate 1010, lattice constants of the substrate and the stacked layer may be mismatched, in which case a defect, such as dislocation, may occur to deteriorate a crystalline structure. Using the buffer layer 1020 may reduce occurrence of such a defect.

Next, as shown in FIG. 3b, an n-type clad layer 1600 is deposited on the buffer layer 1020. The n-type clad layer 1600 is mostly formed of GaN or AlGaN.

An active layer 1500 is formed on the n-type clad layer 1600 (FIG. 3c). The active layer 1500 is a layer in which electrons and holes are recombined to generate light, and a wavelength of light emitted from the LED is determined depending on types of materials forming the active layer 1500 and thickness of the active layer 1500.

As shown in FIG. 3d, a p-type clad layer 1400 is deposited on the active layer 1500. The p-type clad layer 1400 may be formed of GaN, AlGaN or the like.

As shown in FIG. 3e, a transparent material layer 1300 is deposited on the p-type clad layer 1400 in order to form a pattern of the p-electrode 1200. A material forming the transparent material layer 1300 has a refractive index different from that of the p-type clad layer 1400. The transparent material layer 1300 may be deposited using sputtering, electron beams, laser beams or the like. The deposited transparent material layer 1300 may have a thickness of 10 nm. The transparent material layer 1300 may be formed of one material or an alloy of two or more materials selected from a metal oxide group of ITO, ZnO, Ga2O3, NiO, Cu2O, CuO, MgO, SnO, In2O3, BeO, SiO2, Si3N4, WO3, TiO2, AgO and Ag2O or a nitride group of AlN, InN and BN. The transparent material layer 1300 is patterned in various shapes to pattern the p-electrode 1200.

As shown in FIG. 3f, a photoresist 1320 is applied to the transparent material layer 1300 to form a pattern on the transparent material layer 1300. A mask pattern 1340 is disposed over the transparent material layer 1300 with the photoresist 1320 applied, and the transparent material layer 1300 is irradiated with ultraviolet rays (FIG. 3g). The transparent material layer 1300 exposed to light is subjected to wet etching to more deeply etch portions of the transparent material layer 1300 where the photoresist 1320 is removed, thereby forming a stereoscopic pattern on the transparent material layer 1300 in a pattern on the photoresist 1320 (FIGS. 3h and 3i). The stereoscopic pattern on the transparent material layer 1300 may be formed to have a thickness difference between a thinnest portion and a thickest portion of 10 nm.

As shown in FIG. 3i, the transparent material layer 1300 is etched in an embossed hemispherical shape. A p-electrode 1200 is deposited on the transparent material layer 1300 (FIG. 3j). The p-electrode 1200 is formed of a metal or alloy of Ag, Au, Ni, Ru, Ir, Ni, Cu, Cr and the like. The p-electrode 1200 is a reflective metal electrode which forms an ohmic electrode and reflects light emitted from the active layer. After the p-electrode 1200 is formed, the p-electrode 1200 may be subjected to heat treatment under a nitrogen, oxygen or vacuum atmosphere. Although the p-electrode 1200 serves as a reflective metal electrode in the present embodiment, a p-electrode 1200 forming an ohmic electrode may be formed and then a reflective layer may be further provided on the p-electrode 1200. The p-electrode and the reflective layer may be formed of a single metal or alloy of Ag, Al, Ni, Cu, Cr, Au, Cr, Pd and the like.

Further, as the transparent material layer 1300, an oxide may be employed to form a pattern on only a portion of the p-layer, in addition to a conductive material, such as a transparent electrode. In this case, in addition to a conventional conductive transparent electrode, a nonconductive transparent material may be used for patterning. The nonconductive transparent material may include SiO2, Al2O3, AlN and the like.

The p-electrode 1200 is formed on the transparent material layer 1300 formed with the stereoscopic pattern, so that a boundary surface between the p-electrode 1200 and the transparent material layer 1300 has an uneven form. When the manufactured LED 1000 is turned over, the transparent material layer 1300 is in an embossed form and the p-electrode 1200 has an engraved pattern. That is, as shown in FIG. 1, the p-electrode 1200 has a hemispherical engraved pattern, and emitted light is reflected on the p-electrode 1200 formed with the pattern to be emitted at a wider range of radiation angles.

A carrier 1100 is formed on the p-electrode 1200 (FIG. 3k). The carrier 1100 may be formed by electroplating, non-electrolyte plating, sputtering, or wafer bonding of a conductive substrate.

Subsequently, the substrate 1010 is removed by an LLO process. When the sapphire substrate 1010 is irradiated with a laser, the surface of the buffer layer 1020 of gallium nitride is decomposed into gallium (Ga) and nitrogen gas (N2), thus separating the substrate 1010. Although the LLO process is used to separate the substrate 1010 in the present embodiment, chemical lift-off may also be used. After the substrate 1010 is removed, the buffer layer 1020 is removed by etching.

When the LED from which the substrate 1010 and the buffer layer 1020 are removed is turned over, as shown in FIG. 3l, the p-electrode 1200, the transparent material layer 1300, the p-type clad layer 1400, the active layer 1500 and the n-type clad layer 1600 are sequentially deposited on the carrier 1100. A surface of the n-type clad layer 1600 exposed by etching the buffer layer 1020 is roughened to form a texturing on the surface, thereby increasing light extraction efficiency of the vertical-type LED.

An n-electrode 1700 is deposited on the n-type clad layer 1600 of the turned over LED. The n-electrode 1700 may be formed of a metal, such as Ti, Cr or Al, or a transparent electrode, such as ITO or ZnO. The n-electrode 1700 is disposed on top of the turned over LED 1000. Although the n-electrode 1700 occupies a small area on the n-type clad layer 1600, the n-electrode 1700 is formed as an ohmic contact, thereby manufacturing the LED being excellent in current spreading and light emitting efficiency with the n-electrode 1700 occupying a reduced area.

After the p-electrode 1200 and the n-electrode 1700 are formed, bonding pads for wire bonding are formed on the p-electrode 1200 and the n-electrode 1700.

A passivation layer (not shown) of an insulating material may be formed on a side wall of the LED. The passivation layer protects an LED device and prevents leakage of electric current from a side wall of the LED device. The passivation layer may be formed by depositing SiO2, SixNy and the like. The passivation layer may have a thickness of about 200 nm. The LED completely manufactured is separate into each LED by dicing.

(a) and (b) in FIG. 4 illustrate a shape of a p-electrode when a transparent material layer has a pattern in an oval shape in a vertical-type LED according to another embodiment of the present invention, (a) and (b) in FIG. 5 illustrate a shape of a p-electrode when a transparent material layer has a pattern in a quadrangular pyramid shape in a vertical-type LED according to another embodiment of the present invention, (a) and (b) in FIG. 6 illustrate a shape of a p-electrode when a transparent material layer has a pattern in a quadrangular pyramidal frustum shape in a vertical-type LED according to another embodiment of the present invention, (a) and (b) in FIG. 7 illustrate a shape of a p-electrode when a transparent material layer has a pattern in a linear shape in a vertical-type LED according to another embodiment of the present invention, (a) to (d) in FIG. 8 illustrate various pattern shapes of a transparent material layer in a vertical-type LED according to another embodiment of the present invention, and FIG. 9 illustrates a pattern in an irregular shape of a transparent material layer in a vertical-type LED according to another embodiment of the present invention.

As shown in (a) of FIG. 4, a transparent material layer 1300 may be etched in an oval shape in manufacturing the LED 1000. In etching the transparent material layer 1300, a mask pattern is formed in an oval shape and exposed to light, thereby forming an oval stereoscopic pattern. The transparent material layer 1300 formed with an oval photoresist 1320 is etched by wet etching. Here, etching time may be adjusted to adjust height of the stereoscopic pattern and a gap of the pattern array.

A p-electrode 1200 is deposited on the transparent material layer 1300 formed with the oval pattern.

The p-electrode 1200 is deposited directly on the transparent material layer 1300 and thus has a stereoscopic boundary surface with the transparent material layer 1300. That is, as shown in (b) of FIG. 4, the p-electrode 1200 has an oval engrave pattern due to the oval embossed pattern formed on the transparent material layer 1300. The p-electrode 1200 is a reflective electrode, and light emitted from an active layer is reflected by the pattern formed on the p-electrode 1200, thereby not only enhancing reflectance of the LED but dispersing the light in a horizontal direction.

In the present invention, the transparent material layer 1300 may be formed in various shapes by adjusting the shape of the mask pattern and materials and extent of etching of the transparent material layer 1300, and the p-electrode 1200 may be formed to have various patterns based on shapes of the transparent material layer 1300, height of a formed pattern and interval between patterns. Although wet etching is illustrated as an example in the present embodiment, an etching method is not limited thereto. Dry etching may be used to form the transparent material layer 1300. The pattern formed on the transparent material layer 1300 may have a height of 10 nm. A pattern structure of the transparent material layer 1300 may be formed in a regular arrangement of a pattern or irregular arrangement in which at least two patterns are mixed.

FIGS. 5 to 7 illustrate the transparent material layers 1300 having a quadrangular pyramid shape, a quadrangular pyramidal frustum shape and a linear shape. Due to the stereoscopic shapes of the transparent material layers 1300, patterns in a quadrangular pyramid shape, a quadrangular pyramidal frustum shape and a linear shape are engraved in the p-electrodes 1200 deposited on the transparent material layers 1300. In addition to the quadrangular pyramid shape and the quadrangular pyramidal frustum shape, patterns may be formed in diverse polygonal pyramid shapes or polygonal pyramidal frustum shapes or have a linear shape or lattice shape. A pattern shape may also vary depending on deposited materials of the transparent material layers 1300. For example, when a material forming a transparent material layer has a particular crystalline property, a pattern in a polygonal pyramid shape or trapezoid shape is formed. When SiO2 and wet etching are used, a pattern in a hexagonal or hexagonal prism shape may be formed as shown in (a) of FIG. 8.

Meanwhile, as shown in (b) of FIG. 8, the transparent material layer 1300 may have patterns with a small size. Small patterns with a size of several nanometers to tens of nanometers are arranged to reflect emitted light at a wide range of angles. In FIG. 8, (c) illustrates an arrangement of linear patterns on the transparent material layer 1300 in a direction of width of the LED. In addition, linear patterns may be formed in different directions by conducting etching twice, thereby forming a lattice pattern ((d) of FIG. 8). In this case, the linear patterns are formed with different heights in the direction of width of the LED and direction of length of the LED, thereby forming patterns having different radiation angles.

Patterns of the p-electrode 1200 may be adjusted depending on how to form patterns of the transparent material layer 1300, and a reflection angle varies depending on depth of patterns formed in the p-electrode 1200 and intervals between the patterns. A pattern shape of the p-electrode 1200 may be adjusted to adjust reflectance and radiation angle of light.

Although the present embodiment illustrates a regular arrangement of patterns, two or more mixed pattern structures may be irregularly arranged as shown in FIG. 9. In this case, patterns of various shapes may be arranged with different sizes at different intervals.

(a) and (b) in FIG. 10 illustrate deposited forms of a transparent material layer according to an embodiment of the present invention, and FIG. 11 illustrates that a transparent material layer is deposited on a portion of a p-type clad layer in a vertical-type LED according to another embodiment of the present invention.

A transparent material layer 1300 may be deposited on an entire upper portion of a p-type clad layer 1400 or on a portion of the p-type clad layer 1400 to form a pattern. In one embodiment, the transparent material layer 1300 is deposited on an entire upper surface of the p-type clad layer 1400 as shown in (a) of FIG. 10. The transparent material layer 1300 is deposited on the entire upper surface of the p-type clad layer 1400 and etched partially in thickness, thereby forming a pattern. A p-electrode 1200 is stacked on the p-type clad layer 1400 with the transparent material layer 1300 disposed therebetween. Here, in the formed transparent material layer 1300, a difference between minimum thickness of the transparent material layer 1300 and maximum thickness, that is, heights of formed patterns, may be 10 nm. The heights may change depending on materials forming the transparent material layer 1300 or desired radiation angles.

Meanwhile, a transparent material layer 1300 additionally deposited for patterning between a p-type clad layer 1400 and a p-electrode 1200 may be deposited on only a portion of the p-type clad layer 1400, as shown in (b) of FIG. 10. To this end, the transparent material layer 1300 may be deposited on an entire area of the p-type clad layer 1400 and etched until a portion of the p-type clad layer 1400 is exposed. Alternatively, the transparent material layer 1300 is deposited on a portion of the p-type clad layer 1400 and formed into a pattern by etching.

As shown in FIG. 11, a transparent material layer 1300 is deposited on only a portion of a p-type clad layer 1400, and a p-electrode 1200 is entirely deposited thereon. In this case, the p-electrode 1200 is partially in direct contact with the p-type clad layer 1400. In this method, both a conductive material and a nonconductive material may be used as a patterning material of a transparent material layer. Particularly, nonconductive transparent materials frequently used, such as SiO2, Si3N4 and Al2O3 as nonconductive materials, are etched by wet etching to facilitate a patterning process and are autonomously reflective due to a difference in refractive index regardless of a metal reflective layer as a p-electrode to increase overall reflectance of the p-electrode.

When the transparent material layer 1300 is partially deposited on the p-type clad layer 1400, thickness of the transparent material layer 1300, that is height of a formed pattern, may be 10 nm.

In the vertical-type LED according to the present invention, the transparent material layer is etched to form the pattern of the p-electrode. That is, a pattern is formed in the transparent layer which is easy to etch into a desired shape, after which the p-electrode is formed on the transparent material layer formed with the pattern, thereby forming various patterns without damaging the p-electrode. Accordingly, reflectance of light may be improved, a radiation angle of the LED may be widened, and the patterns are adjusted as necessary to adjust the radiation angle. The vertical-type LED according to the present invention improves reflectance of emitted light and achieves a wide range of radiation angles using the transparent material layer formed with the pattern, thus being effective for an LED for lighting.

(a) and (b) in FIG. 12 schematically illustrate an ultraviolet LED according to another embodiment of the present invention, and FIG. 13 illustrates transmittance of an ITO thin film according to a wavelength of light.

The ultraviolet LED emits different wavelengths of light depending on types of materials forming an active layer and thickness of the active layer. In an electrode formed of ITO, when infrared light or visible light is emitted, there is no problem. However, when ultraviolet rays are emitted, the ITO electrode absorbs the emitted ultraviolet rays. To solve such a problem, a p-electrode is formed on only a portion of a p-type clad layer in the ultraviolet LED according to the other embodiment of the present invention, as shown in FIG. 12. In the present embodiment, a description of the same configuration as in the foregoing embodiment will be omitted.

Specifically, to manufacture an ultraviolet LED according to another embodiment of the present invention, a buffer layer 2200, an n-type clad layer 2300, an active layer 2400, a p-type clad layer 2500, a p-electrode 2600 and an n-electrode 2700 are formed on a substrate 2100. The substrate 2100 may generally employ silicon (Si), silicon carbide (SiC), sapphire (a-Al2O3), gallium arsenide (GaAs) or the like.

The buffer layer 2200 is formed on the substrate 2100, and the n-type clad layer 2300 is deposited on the buffer layer 2200. The n-type clad layer 2300 is mostly formed of GaN or AlGaN.

The active layer 2400 is formed on the n-type clad layer 2300. A wavelength of light emitted from the ultraviolet LED is determined depending on types of materials forming the active layer 2400 and thickness of the active layer 2400. The active layer for ultraviolet light emitting may employ GaN, AlGaN, InGaN or AlGaInN including a small amount of indium (In) or the like. In the present embodiment, composition of materials forming the active layer 2400 is adjusted so that the wavelength of the emitted light is 280 to 400 nm.

The p-type clad layer 2500 is deposited on the active layer 2400. In the ultraviolet LED based on a nitride semiconductor, the p-type clad layer 2500 is formed of GaN, AlGaN or the like. Using an Al-based element the p-type clad layer 2500 may further widen a band gap. As necessary, a heavily doped p-type clad layer or a p-InGaN layer including a small amount of In may be deposited on the p-type clad layer to improve ohmic contact resistance with an electrode layer.

The p-electrode 2600 and the n-electrode 2700 are formed on a nitride semiconductor layer or partially etched nitride semiconductor layer. The p-type clad layer 2500, the active layer 2400 and the n-type clad layer 2300 are partially etched to expose the n-type clad layer 2300, thereby preparing an area for the n-electrode 2700. The n-electrode 2700 is formed on the exposed n-type clad layer 2300. The n-electrode 2700 may be formed of a metal, such as Cr or Al. After the p-electrode 2600 and the n-electrode 2700 are formed, bonding pads 2620 and 2720 for wire bonding are formed on the p-electrode 2600 and the n-electrode 2700.

Next, the p-electrode 2600 is described.

The p-electrode 2600 is deposited on the p-type clad layer 2500. The p-electrode 2600 is deposited using an ITO material with excellent contact resistance and current spreading and particularly high transmittance. The deposited ITO has a thickness of 30 nm. Light emitted from the active layer 2400 exits through the p-electrode 2600 in contact with an upper portion of the p-type clad layer 2500. However, when an ITO thin film is used as the p-electrode, as shown in FIG. 13, the ITO thin film exhibiting high transmittance in a visible light region has dramatically reduced transmittance in an ultraviolet region of 400 nm or less due to high absorption rate. Thus, when an ITO thin film is used as the p-electrode 2600 in the ultraviolet LED 2000, the ITO thin film absorbs ultraviolet rays emitted from the active layer of the LED to significantly reduce light extraction efficiency of the LED, resulting in a decrease in light efficiency of the LED. Accordingly, in the present invention, the p-electrode 2600 is deposited to occupy 70% or less of the area of the p-type clad layer 2500 in order to reduce absorption rate of emitted ultraviolet rays passing through the ITO electrode.

To this end, in the present embodiment, the ITO p-electrode is manufactured in a mesh form. That is, the p-electrode 2600 is selectively deposited on only a portion of the p-type clad layer 2500. Width of lines of the p-electrode in the mesh form may be changed from several nanometers to tens of micrometers. As the width of the lines is thinner, the p-electrode 2600 occupies a smaller area in the ultraviolet LED 2000, thereby improving efficiency of the ultraviolet LED 2000.

In detail, the p-electrode 2600 may have a width of 5 nm. As the width of the lines of the p-electrode 2600 is thinner, the p-electrode 2600 occupies a smaller area on the p-type clad layer 2500, thereby improving efficiency of the ultraviolet LED. The width of the lines of the p-electrode may be changed up to tens of micrometers depending on a material forming the p-electrode 2600 and characteristics of the nitride semiconductor forming the p-type clad layer 2500.

Meanwhile, thickness of the p-electrode 2600 may be changed to improve characteristics of the electrode, such as current spreading. Specifically, the p-electrode 2600 may be formed to have a thickness of 30 nm. When the thickness of the p-electrode 2600 is greater, the characteristics including current spreading may be less affected with the width of the lines of the p-electrode 2600 being thin. The thickness of the p-electrode 2600 may vary depending on material qualities and characteristics of the ultraviolet LED based on the nitride semiconductor.

(a) and (b) in FIG. 14 illustrate a p-electrode in a punched plate form in an ultraviolet LED according to another embodiment of the present invention, FIG. 15 illustrates a p-electrode in a one-dimensional grid form in an ultraviolet LED according to another embodiment of the present invention, FIG. 16 illustrates a p-electrode in a one-dimensional grid form in an ultraviolet LED according to another embodiment of the present invention, and FIG. 17 illustrates a p-electrode in a one-dimensional grid form in an ultraviolet LED according to another embodiment of the present invention.

Although the present embodiment illustrates the p-electrode 2600 in a mesh form, the p-electrode 2600 may have a punched plate form, a one-dimensional grid form and the like. As shown in (a) and (b) of FIG. 14, the p-electrode 2600 may have a plate form in which circular shapes or hexagonal shapes are punched. In this electrode, 30% or greater of area of an upper surface of the p-type clad layer 2500 may be exposed by the circular shapes or hexagonal shapes. Sizes of the circular shapes or hexagonal shapes may be changed variously in embodiments, and various polygonal shapes may be used without being limited thereto.

Alternatively, as shown in FIGS. 15 and 16, the p-electrode 2600 may have a one-dimensional grid form. In FIG. 15, p-electrodes 2600 are formed on the p-type clad layer 2500 in a radial shape based on the bonding pad 2620. A plurality of radial p-electrodes 2600 overlap with linear-shaped p-electrodes 2600 disposed from the bonding pad 2620. Accordingly, the p-electrodes 2600 occupy a further reduced area on the p-type clad layer 2500, while current spreading is improved. An interval between the p-electrodes 2600 may increase in a radial direction based on the bonding pad 2620. As intervals between lines forming the p-electrodes 2600 increase, area of the p-type clad layer 2500 increases to improve efficiency of the ultraviolet LED. The intervals between the lines may be optimized according to a structure of the LED in view of current spreading, thereby improving light properties maximally.

As shown in (a) and (b) of FIG. 16, the p-electrode 2600 may be formed with a plurality of parallel lines. In this case, an interval between the p-electrodes 2600 is increased as the p-electrodes 2600 are farther from the bonding pad, and this structure allows the p-electrodes 2600 to occupy an even smaller area in an upper part of the ultraviolet LED 2000, thereby increasing regions for emission of ultraviolet rays. Alternatively, as shown in FIG. 17, in the p-electrode 2600 in a mesh form, spots where horizontal lines and vertical lines cross are formed thick, for example, in dots, so that electric current spreads easily.

When the p-electrode 2600 is deposited on a portion of the p-type clad layer 2500, that is, only 70% or less of the area of the p-type clad layer 2500, emitted ultraviolet rays are less absorbed while passing through the ITO electrode and a high-efficiency electrode may be provided. An area for forming the p-electrode 2600 may be 3% to 70%, preferably 10% to 50% of the area of the upper surface of the p-type clad layer 2500. When the area of the p-electrode 2600 is greater than 70% of the area of the upper surface of the p-type clad layer 2500, light extraction efficiency may be reduced. When the area of the p-electrode 2600 is less than 3% of the area of the upper surface of the p-type clad layer 2500, electric current may not be properly supplied to the nitride semiconductor layer. The p-type clad layer 2500 is exposed 30% or more to increase ultraviolet extraction efficiency.

Although the ITO thin film is used as the p-electrode 2600 in the present embodiment, oxides, such as MgO, BeO ZnO, Ga2O3, SnO, CuO, Cu2O, AgO2 and AgO, and mixtures of two or more materials among these oxides, such as ZnMgO and ZnBeO, may be used, in addition to ITO, as a material forming the p-electrode 2600 in other embodiments.

Meanwhile, when the p-electrode 2600 is manufactured in the mesh form, the p-electrode 2600 occupies a smaller area on the p-type clad layer 2500, and thus a transparent electrode, such as ITO, is not necessarily used to form the p-electrode 2600. The p-electrode 2600 may be formed using not only a transparent electrode material, such as ITO, but also a metal electrode material frequently used for a p-electrode, such as Ag, Ni/Au, Ni, Pd, In, Zn, Mg and Pt. The p-electrode 2600 may be formed using a single metal or alloy of two or more metals among Ag, Ni, Pd, In, Zn, Mg and Pt. A metal electrode has lower ohmic contact resistance with the p-type clad layer 2500 than an oxide transparent electrode and thus is considered to exhibit greater effects of spreading electric current and reducing driving voltage.

An oxide electrode including ITO or metal electrode may selectively be deposited in a mesh form on the p-type clad layer 2500 by using electron beams or laser beams. When the electrode is formed in the mesh form, absorption of ultraviolet rays does not occur in a portion where the electrode is not deposited, so that transmittance of ultraviolet rays increases. According to a deposition method, an ITO thin film may be deposited on the p-type clad layer 2500 and partially etched into a mesh form. In this case, however, even the p-type clad layer 2500 may be etched to deteriorate electrical properties of the thin film and to cause unsmooth current spreading, and the process is also complicated. In the present invention, selective deposition using beams is employed, by which an electrode may be designed not to affect current spreading by adjusting width and interval of a mesh.

Meanwhile, printing may be used to deposit an ITO thin film in a desired shape. When a printer is used for deposition, the ITO thin film may easily be deposited in various shapes without being subjected to an exposure process and fine lines may be formed. The ITO thin film has good current spreading and thus allows electric current to evenly spread to the p-type clad layer 2500 and the active layer 2400 with fine lines, thereby improving light emitting efficiency in the active layer 240.

Since ultraviolet rays emitted from the active layer 2400 are emitted through a portion where the p-electrode 2600 is not deposited, light may be smoothly transmitted in an upward direction, thus enhancing ultraviolet emission efficiency. In addition, as the p-electrode 2600 occupies a reduced area in the upper portion of the ultraviolet LED, the p-electrode 2600 may not need to be transparent and thus is allowed to employ a metal, such as Ag, Ni, Pd, In, Zn, Mg and Pt, having good electrical conductivity, thereby providing more options of materials and reducing manufacture cost.

Meanwhile, an ohmic contact layer in the same form as that of the p-electrode 2600 may be further provided between the p-type clad layer 2500 and the p-electrode 2600 to be favorable for formation of an ohmic contact. The ohmic contact layer may employ Ag, Pd or Ni, a metal alloy or a transparent electrode material, thereby reducing a sheet resistance value of the p-electrode 2600 and improving current spreading. Due to the ohmic contact layer, the p-electrode 2600 may evenly disperse electric current to evenly spread the electric current to the active layer 2400 and to improve light emitting efficiency of the ultraviolet LED 2000.

Generally, energy efficiency of an LED is approximately 40% or higher and is affected by internal quantum efficiency, light extraction efficiency, electrical efficiency, package efficiency and the like. Here, internal quantum efficiency is related to polarity of a substrate and a layer growing on the substrate and is steadily increased by preventing defects of materials and growing a thin film on the substrate by MOCVD using various high-purity growth materials. Electrical efficiency is efficiency in injecting electrons into the LED from an external power source, which is related to a chip process technique. Light extraction efficiency is efficiency in allowing light generated inside the LED to maximally escape to the outside, which may be further enhanced by modifying the form of the p-electrode 2600 in the embodiment of the present invention.

(a) and (b) in FIG. 18 illustrate width of a portion of a p-electrode adjacent to a bonding pad in an ultraviolet LED according to an embodiment of the present invention.

A bonding pad 2620 is provided on a p-electrode 2600. When electric current is supplied to the p-electrode 2600, a bottleneck phenomenon may occur at a portion of the p-electrode 2600 adjacent to the bonding pad 2620. When electric current does not properly spread by the bottleneck phenomenon, light emitting efficiency of the LED is inevitably reduced. To avoid a decrease in light emitting efficiency, the p-electrode 2600 may be formed to have a non-uniform width at an area adjacent to the bonding pad 2620, as shown in (a) and (b) of FIG. 18. When the p-electrode 2600 is in a mesh form, one or two horizontal lines and vertical lines adjacent to the bonding pad 2620 may be formed to have a thicker width than that of lines in a different area. When the p-electrode 2600 is in a radial shape, one horizontal line, one vertical line and a first concentric circle adjacent to the bonding pad 2620 may be formed to have a thicker width than that of lines in a different area. A portion of the p-electrode 2600 adjacent to the bonding pad 2620 is formed thick, so that electric current uniformly spreads in the entire p-electrode 2600. In another embodiment, a portion of a p-electrode adjacent to a bonding pad may be formed thick not only in width but also in thickness.

The ultraviolet LED according to the present invention minimizes absorption of ultraviolet rays emitted from the active layer by the p-electrode without affecting current spreading of the p-electrode, thereby exhibiting high optical efficiency.

The embodiments of the present invention illustrated in the present specification and drawings are present as specific examples to easily explain the technical contents of the present invention and to enhance understanding of the present invention and are not provided to limit the scope of the present invention. It will be apparent to those skilled in the art to which the present invention pertains that various modifications and variations may be made based on the technical idea of the present invention in addition to the embodiments disclosed herein.

INDUSTRIAL APPLICABILITY

In a vertical-type light emitting diode (LED) according to the present invention, a pattern of a p-electrode is formed by etching a transparent material layer. That is, a pattern is formed in the transparent layer which is easy to etch into a desired shape, after which the p-electrode is formed on the transparent material layer formed with the pattern, thereby forming various patterns without damaging the p-electrode. Accordingly, reflectance of light may be improved, a radiation angle of the LED may be widened, and the patterns are adjusted as necessary to adjust the radiation angle. The vertical-type LED according to the present invention improves reflectance of emitted light and achieves a wide range of radiation angles using the transparent material layer formed with the pattern, thus being effective for an LED for lighting.

Further, the present invention may selectively form a p-electrode on a p-type clad layer in an ultraviolet LED, thereby improving transmittance of emitted light. When ultraviolet rays are emitted from the LED, even though the p-electrode is formed of ITO, ultraviolet rays are not absorbed in a portion where the electrode is not deposited, thus improving transmittance of ultraviolet rays. Furthermore, the p-electrode may not need to be transparent and thus is allowed to employ a metal, such as Ag, Ni, Pd, In, Zn, Mg and Pt, having good electrical conductivity, thereby providing more options of materials and reducing manufacture cost. The ultraviolet LED according to the present invention minimizes absorption of ultraviolet rays emitted from an active layer by the p-electrode without affecting current spreading of the p-electrode, thereby exhibiting high optical efficiency.

The present invention relates to a vertical type light emitting diode, a method for manufacturing the same, an ultraviolet ray light emitting diode, and a method for manufacturing the same. A vertical type light emitting diode according to the present invention is on the basis of a nitride semiconductor having a p-n conjunction structure, a transparent material layer is formed on a p type clad layer, the transparent material layer having a refractive index different from that of the p type clad layer and having a pattern structure. A reflective metal electrode layer is formed on the transparent material layer as a p-electrode. After a stereoscopic pattern is formed in the transparent material layer, the p-electrode is deposited, and thus a pattern is formed in the p-electrode. Light from an active layer is emitted in a wide radiation angle by the pattern formed in the p-electrode, and reflectance is improved according to a patterned form and a refractive index of a material. Meanwhile, in depositing the p-electrode on the p type clad layer in the ultraviolet ray light emitting diode, when the p-electrode is deposited on only 10 to 70% of the upper portion of the p type clad layer, an area where the p type clad layer is exposed is wide, therefore it is possible to increase a transmittance of ultraviolet rays through an area where the p-electrode is not deposited. A form of the p-electrode may be a mesh form, a punched plate form, a one-dimensional grid form, etc. The vertical type light emitting diode of the present invention is manufactured through a simple process, and has high reflection efficiency since light is emitted in a wide angle by the pattern of the p-electrode. Therefore, the present invention can provide a highly efficient vertical type light emitting diode. In addition, even when emitted light is ultraviolet rays, a transmittance can be increased.

The invention claimed is:

1. A method for manufacturing an ultraviolet light emitting diode based on a nitride semiconductor, the method comprising:
    forming a nitride semiconductor layer in which an n-type clad layer, an active layer and a p-type clad layer are sequentially stacked;
    forming an n-electrode on the n-type clad layer;
    forming a p-electrode on an upper surface of the p-type clad layer such that the p-electrode is deposited on only 3% to 70% of an area of the upper surface of the p-type clad layer; and
    forming a bonding pad on the p-electrode,
    wherein the p-electrode is formed of one of ITO, ZnO, $Ga_2O_3$, SnO, CuO, $Cu_2O$, $AgO_2$ and AgO,
    wherein the p-electrode is formed as a plurality of non-parallel first p-electrode lines extending radially from the bonding pad and a plurality of second p-electrode lines extending across the first p-electrode lines, and
    wherein a gap between first p-electrode lines increases radially with increased distance from the bonding pad.

2. The method of claim 1, wherein a width of a portion of the p-electrode located adjacent to the bonding pad is formed to have a thicker width than that of a portion of the p-electrode located distal to the bonding pad.

3. The method of claim 1, wherein the composition of materials forming the active layer is adjusted to emit light having a wavelength of 280 to 400 nm.

4. A method for manufacturing an ultraviolet light emitting diode based on a nitride semiconductor, the method comprising:
    forming a nitride semiconductor layer in which an n-type clad layer, an active layer and a p-type clad layer are sequentially stacked;
    forming an n-electrode on the n-type clad layer;
    forming a p-electrode on an upper surface of the p-type clad layer such that the p-electrode is deposited on only 3% to 70% of an area of the upper surface of the p-type clad layer; and
    forming a bonding pad on the p-electrode,
    wherein the composition of materials forming the active layer is adjusted to emit light having a wavelength of 280 to 400 nm,
    wherein the p-electrode is formed as a plurality of non-parallel first p-electrode lines extending radially from the bonding pad and a plurality of second p-electrode lines extending across the first p-electrode lines, and
    wherein a gap between first p-electrode lines increases radially with increased distance from the bonding pad.

5. The method of claim 4, wherein the p-electrode is formed of one of ITO, ZnO, $Ga_2O_3$, SnO, CuO, $Cu_2O$, $AgO_2$ and AgO.

6. The method of claim 4, wherein a width of a portion of the p-electrode located adjacent to the bonding pad is formed to have a thicker width than that of a portion of the p-electrode located distal to the bonding pad.

* * * * *